(12) United States Patent
Salama et al.

(10) Patent No.: US 7,213,325 B2
(45) Date of Patent: May 8, 2007

(54) METHOD OF MANUFACTURING FE-SHEATHED MGB2 WIRES AND SOLENOIDS

(75) Inventors: Kamel Salama, Houston, TX (US); Hui Fang, Houston, TX (US)

(73) Assignee: Board of Regents, University of Houston, Houston, TX (US)

( * ) Notice: Subject to any disclaimer, the term of this patent is extended or adjusted under 35 U.S.C. 154(b) by 144 days.

(21) Appl. No.: 11/050,186

(22) Filed: Feb. 3, 2005

(65) Prior Publication Data

US 2005/0170972 A1    Aug. 4, 2005

Related U.S. Application Data

(60) Provisional application No. 60/541,520, filed on Feb. 3, 2004, provisional application No. 60/541,309, filed on Feb. 3, 2004.

(51) Int. Cl.
*H01L 39/24* (2006.01)

(52) U.S. Cl. ............... 29/599; 174/125.1; 505/230; 505/704

(58) Field of Classification Search ............... 29/599; 174/125.1; 505/230, 704
See application file for complete search history.

(56) References Cited

U.S. PATENT DOCUMENTS

| | | | |
|---|---|---|---|
| 6,687,975 B2 * | 2/2004 | Tomsic | 29/599 |
| 6,957,480 B2 * | 10/2005 | Giunchi et al. | 29/599 |
| 2003/0173103 A1 * | 9/2003 | Morita et al. | 174/125.1 |

OTHER PUBLICATIONS

Fabrication and Properties of Monofilamentary MgB/sub2/ Superconducting Tapes, by Graaso, G.; Malagoli, A; Modica, M.; Tumino, A.; Fereghini, C. et al ; Superconductor Science & Technology Conference Title; supercon. Sci. Tech. (UK) vol. 16, No. 2, p. 271-5; Published Feb. 2003.*

"Rapid Communication—Densification of MgB cores in iron-clad tapes", H. Fang, et al., Superconductor Science and Technology, vol. 17, pp. 127-129, 2004.

"Transport critical current on Fe-sheathed MgB2 coils", H. Fang, et al., Superconductor Science and Technology, vol. 17, pp. 717-720, 2004.

High critical current density in iron-clad MgB2 tapes, H. Fang, et al.,Applied Physics Letters vol. 82, No. 23, pp. 4113-4115, 2004.

* cited by examiner

*Primary Examiner*—Carl J. Arbes
(74) *Attorney, Agent, or Firm*—Jennifer S. Sickler; Gardere Wynne Sewell LLP

(57) ABSTRACT

A method of manufacturing a Fe-sheathed $MgB_2$ wire includes the steps of:
I. Selecting a carbon steel tube with 0.1% to 0.3% carbon;
   a. Crimping a first end of the tube;
   b. Selecting a Mg powder at least 99.8% pure, and sized for 325 mesh;
   c. Selecting a B powder, at least 99.99% pure, and sized for 325 mesh;
   d. Stoichiometrically mixing the Mg and B powders to form a mixture powder;
   e. Milling the mixture powder by using high-energy ball mill for 0.5 to 6 hours and using stainless steel mixing balls and vial, wherein the mass ratio of ball to powder is 20:1, to form a milled powder;
   f. Filling and packing the tube in an argon atmosphere with the milled powder to create a packing density of about 1.5 $g/cm^3$;
   g. Crimping the second end of the tube to create a powder-filled tube;
   h. Rolling the powder-filled tube to create the Fe-sheathed $MgB_2$ wire; and
   i. Annealing the as-rolled wire at 600 to 900° C. for 0.5 to 3 hours at high purity argon environment to create superconducting wire.

3 Claims, 3 Drawing Sheets

METHOD OF MANUFACTURING FE-SHEATHED MGB2 WIRES AND SOLENOIDS

CROSS-REFERENCE TO RELATED APPLICATIONS

This application claims the benefit of the following U.S. Provisional Applications: Nos. 60/541,520 and Ser No. 60/541,309, filed Feb. 3, 2004.

STATEMENT REGARDING FEDERALLY SPONSORED RESEARCH OR DEVELOPMENT

Not Applicable.

REFERENCE TO A "SEQUENTIAL LISTING", A TABLE, OR A COMPUTER PROGRAM LISTING APPENDIX SUBMITTED ON A COMPACT DISC

Not Applicable.

BACKGROUND OF THE INVENTION

1. Field of the Invention

The present invention relates to the field of Fe-sheathed $MgB_2$ superconducting wires and tapes, and methods of manufacturing them.

2. Description of the Related Art

The discovery of superconductivity at 39 K in basic intermetallic magnesium diboride by Nagamatsu et al. triggered a large volume of research on the basic physics of this material as well as its applied superconductivity. The absence of weak-links between microcrystals or grains of this material reported by Larbalestier et al. demonstrated its advantage over high-$T_c$ oxide superconductors. Cryogen-free cooling in the temperature range of 20 to ~30 K requires the development of $MgB_2$ tapes and wires with superior transport currents under an external magnetic field. Currently, the powder-in-tube (PIT) method is widely used to fabricate $MgB_2$ tapes and wires, where $MgB_2$ powder or a mixture of Mg and B powders with the stoichiometric composition is packed into a metal tube. The powder-filled metal tube is then cold-worked (swaging, drawing, and rolling) into tape or wire. A heat treatment at 600~1000° C. is usually applied to the cold-worked tape or wire to obtain superconductivity. The sheath material's toughness and chemical compatibility with $MgB_2$ are crucial for fabricating long-length $MgB_2$ tapes or wires with high critical current, which leaves Fe and Ni as the ideal candidates. Grasso et al. first reported high critical current density of $10^5$ A/cm$^2$ at 4.2 K on nickel-sheathed tapes without any heat treatment. High $J_c$ of about $3 \times 10^5$ A/cm$^2$ was acquired by extrapolating the $J_c$-B curves to zero field. Wang et al. and Horvat et al. investigated Fe-clad $MgB_2$ tapes and wires in the temperature regime above 20 K, and obtained $J_c$ of $10^4$ A/cm$^2$ at 30 K and 1 T. Komori et al. reported $J_c$ of the $MgB_2$ tape exceeding $10^5$ A/cm$^2$ at 4.2 K and 10 T. However, these impressive values were obtained on short samples with lengths of several centimeters. For large-scale applications, what is needed is long length $MgB_2$ wires and tapes with superior transport properties. What is needed to accomplish this is a very small size powder, which will result in high packing density and better grain connectivity.

Some $MgB_2$ solenoids with different sizes have been fabricated and tested. Soltanian et al. obtained a $J_c$ of $1.33 \times 10^5$ A/cm$^2$ at 4 K on a Cu-sheathed $MgB_2$ solenoid with an OD of 10 mm and 5 turns manufactured by a wind-reaction in situ technique. They also tested several 10 mm OD and 100 turn Cu-sheathed $MgB_2$ solenoids and acquired an $I_c$ above 100 A at 4 K. Machi et al. achieved a $J_c$ of $4.4 \times 10^5$ A/cm$^2$ at 4.2 K on a Cu-sheathed $MgB_2$ coil with 27 mm ID and 50 turns, while the $I_c$ was greater than 200 A. However, the industry needs better methods to manufacture application components such as solenoids from wires and tapes.

SUMMARY OF THE INVENTION

A method of manufacturing a Fe-sheathed $MgB_2$ wire, comprising the steps of:
 a. Selecting a carbon steel tube with 0.1% to 0.3% carbon;
 b. Crimping a first end of the tube;
 c. Selecting a Mg powder at least 99.8% pure, and sized for 325 mesh;
 d. Selecting a B powder, at least 99.99% pure, and sized for 325 mesh;
 e. Stoichiometrically mixing the Mg and B powders to form a mixture powder;
 f. Milling the mixture powder by using high-energy ball mill for 0.5 to 6 hours and using stainless steel mixing balls and vial, wherein the mass ratio of ball to powder is 20:1, to create a milled powder;
 g. Filling and packing the tube in an argon atmosphere with the milled powder to create a packing density of about 1.5 g/cm$^3$;
 h. Crimping the second end of the tube to create a powder-filled tube;
 i. Rolling the powder-filled tube to create the Fe-sheathed $MgB_2$ wire; and
 j. Annealing the as-rolled wire at 600 to 900° C. for 0.5 to 3 hours at high purity argon environment to create superconducting wire.

The applications of the Fe-sheathed $MgB_2$ superconducting wires and tapes with high transport properties include large-scale superconducting electric devices for the power industry, such as fault-current controllers, large motors and generators, superconducting magnetic energy storage systems, and transformers.

DETAILED DESCRIPTION

The powder-in-tube (PIT) method is used to fabricate the Fe-sheathed $MgB_2$ wires. The starting 1020 iron-tube (plain carbon steel with 0.2% of carbon) has an outer diameter of 6 mm and a wall thickness of 1 mm. One end of the iron tube is crimped, and then the tube is filled with the desired precursor powder. The remaining end of the tube is crimped after filling. Commercially available Mg powders (Alfa-Aesar, nominally 99.8% pure, −325 mesh) and B powder (Alfa-Aesar, nominally 99.99%, amorphous phase, −325 mesh) are stoichiometrically mixed. This powder mixture is then milled by a Spex-8000 high-energy ball mill for 2 hours. Stainless steel balls and vial are used as the milling medium, and the mass ratio of ball to powder is 20:1. The entire filling procedure is carried out in an argon atmosphere. The packing density is 1.5 g/cm$^3$. The powder-filled tube is rolled using a groove rolling mill with 17 different groove sizes from 6 mm to 1 mm. A square wire with the dimensions of 1 mm by 1 mm in cross-sectional area is gradually obtained. The as-rolled wires are wound into solenoids with different dimensions. These solenoids are annealed at 600° C.–900° C. for 0.5 hours to 3 hours. A high purity argon gas flow is maintained throughout the heat treatment process.

Figure 1:
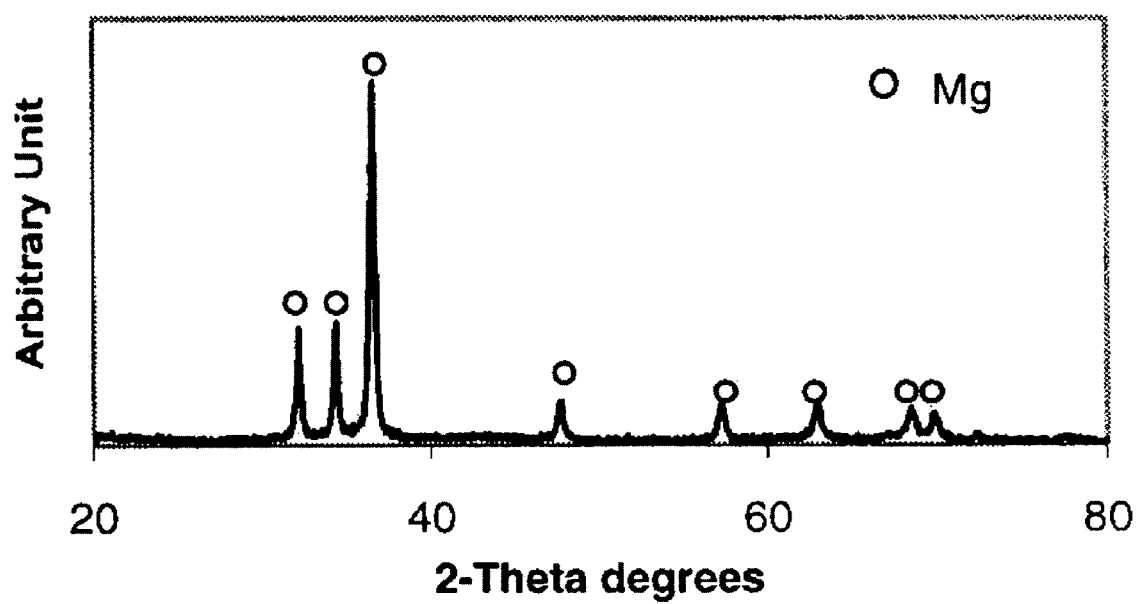
FIG. 1 is a graph showing the x-ray diffraction ("XRD") patterns of the as-milled Mg and B powder mixture.

Referring now to FIG. 1, all the peaks of the x-ray diffraction ("XRD") patterns of the as-milled Mg and B powder mixture are associated with Mg, which indicates that within 2 hours of milling, Mg and B do not react to form $MgB_2$ phase. The broadening of the x-ray peaks reveals that two-hour ball milling decreases the Mg particle size as confirmed by scanning electron microscopy (SEM). The initial particle sizes of Mg and B are all about 40 μm, whereas after high-energy ball milling, the particle sizes are reduced to 200 to 300 nm. No iron contamination from milling medium was detected.

An as-rolled eighteen-meter long Fe-sheathed $MgB_2$ square wire was flexible and uniform, and the surface was shiny and metallic. No open cracks or leakage of the $MgB_2$ core material were perceived. The morphology of the annealed wire demonstrated a uniform $MgB_2$ core in the middle, without obvious pores or cavities. The core density was about 2.55 g/cm$^3$, the highest density identified for wires. The cross-sectional area of the $MgB_2$ core was about $2 \times 10^3$ cm$^2$, whereas the superconducting fill factor was about 20% of the whole conductor cross-section area. The $MgB_2$ grains align parallel to its longitudinal direction.

The long as-rolled wire was further wound along a helix of 12 mm diameter to form solenoids. A solenoid with 12 mm diameter and 12 turns was prepared using this winding procedure. The solenoid's dimension was confined by the spatial limit of the testing facility used. The solenoid was sintered at 850° C. for thirty minutes in a tube under a high purity argon gas flow. Current and voltage contacts were soldered to the solenoid directly. Two voltage contacts were six turns (23 cm) away from each other.

Figure 2:
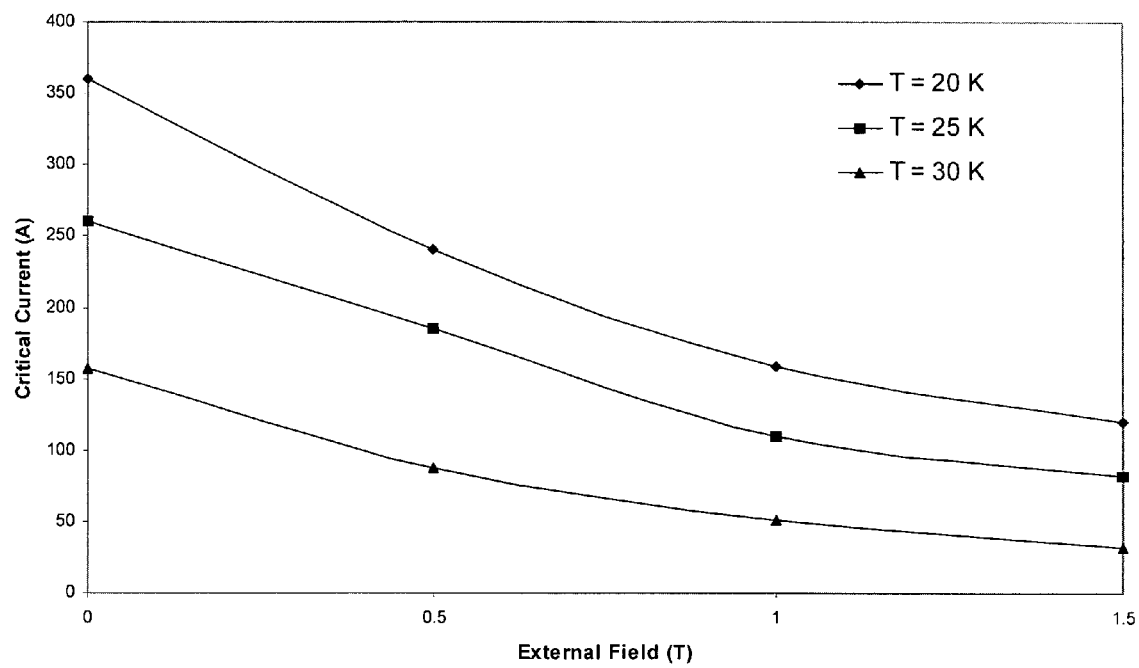
FIG. 2 is a graph showing field dependence of critical current of a 12 mm solenoid.

Referring now to FIG. 2, without external magnetic field, the critical current is 360 A at 20 K, 260 A at 25 K, and 157 A at 30 K. These values are equivalent to $J_c$ of $1.8 \times 10^5$ A/cm$^2$, $1.3 \times 10^5$ A/cm$^2$, and $7.9 \times 10^4$ A/cm$^2$, respectively. At 1Tesla, the critical current is 159 A at 20 K, 110 A at 25 K, and 51 A at 30 K. Even at 1.5 Tesla, this solenoid still possesses a useful critical current value of 120 A at 20 K.

The solenoid manufacturing process was scaled up to wind the as-rolled wire along a stainless steel mandrel with a diameter of 14 cm. A post-winding anneal was carried out at 850° C. for thirty minutes in a box furnace under a high purity argon gas flow. The as-manufactured solenoid had an ID of 14 cm, and 10 turns. This solenoid was mounted in a large cryogenic system. A DC current source with the maximum current of 250 A was used. Current and voltage contacts were soldered to the solenoid directly. The distance between two voltage contacts is about 4 m.

Figure 3:
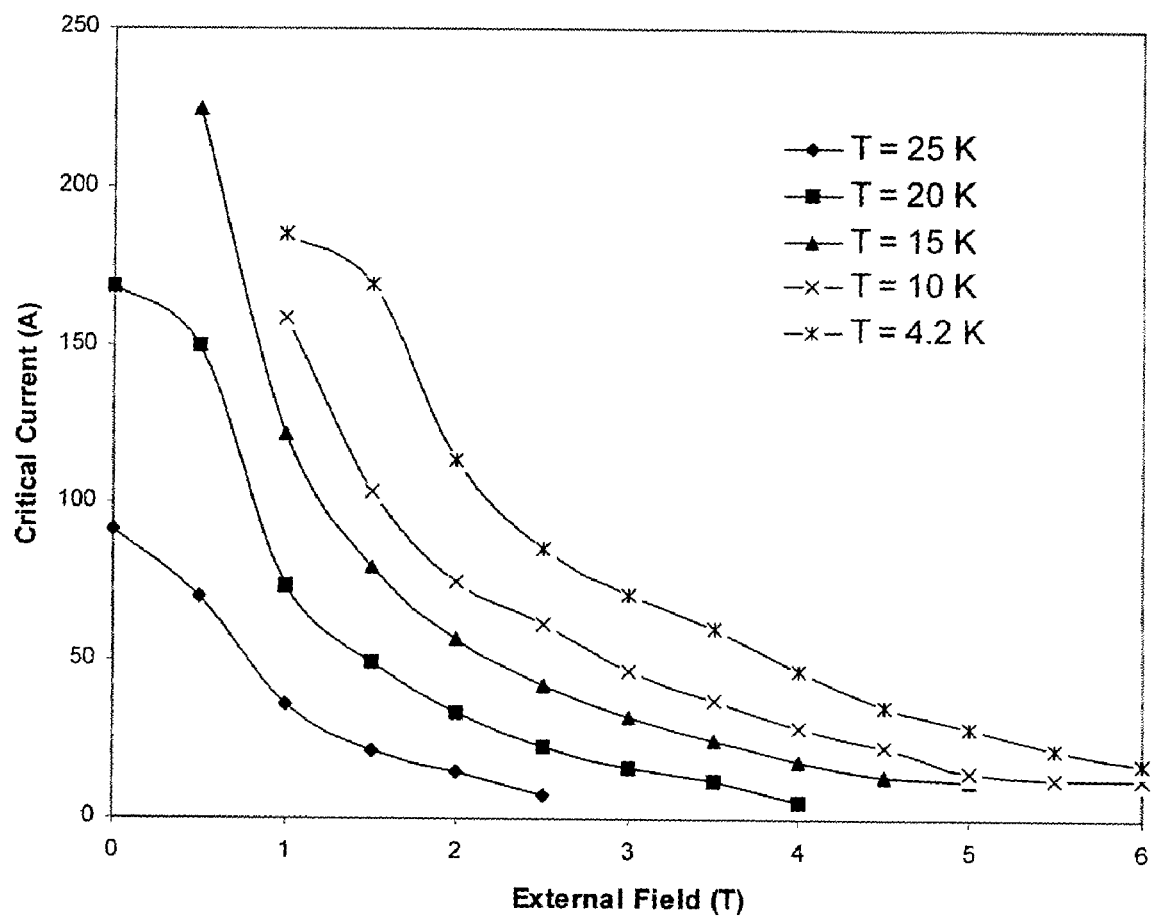
FIG. 3 is a graph showing field dependence of critical current of a 14 cm solenoid.

Referring now to FIG. 3, due to the limitation of the current source, no transition can be observed at 4.2 K and 10 K until more than 1 Tesla external field is applied. At 1 Tesla, the critical current value was 36 A at 25 K, 75 A at 20 K, 122 A at 15 K, 158 A at 10 K, and 185 A at 4.2 K. Even at 6 Tesla, this solenoid has a critical current value of about 20 A at 4.2 K. The extrapolation to 0 Tesla of this critical current (Y-axis) to the external field curve (X-axis) gives a critical current of 340 A at 15 K. This solenoid showed no measurable voltage (<1 μV) and no temperature increase during a one hour, 100 A test at 20 K.

It is not intended that the descriptions above be regarded as limitations upon the present invention.

We claim:

1. A method of manufacturing a solenoid, comprising the steps of:
   a. Selecting a carbon steel tube;
   b. Crimping a first end of the tube;
   c. Selecting Mg powder and B powder;
   d. Mixing Mg powder and B powder stoichiometrically to form a mixture powder;
   e. Milling the Mg and B mixture powder to form a milled powder;
   f. Filling and packing the tube with the milled powder;
   g. Crimping a second end of the tube to create a powder-filled tube:
   h. Rolling the powder-filled tube to create a Fe-sheathed $MgB_2$ wire;
   i. Winding the $MgB_2$ wire along a helix to form a solenoid;
   j. Annealing, in argon gas, the solenoid between 600° C. and 900° C. for 0.5 hour to 3 hours; and
   k. Soldering current and voltage contacts to the solenoid.

2. The method of claim 1, wherein the annealing is done at 850° C. for thirty minutes.

3. The method of claim 2, wherein two voltage contacts are 23 cm away from each other.

* * * * *